(12) United States Patent
Kita

(10) Patent No.: US 7,115,936 B2
(45) Date of Patent: Oct. 3, 2006

(54) FERROELECTRIC THIN FILM ELEMENT AND ITS MANUFACTURING METHOD, THIN FILM CAPACITOR AND PIEZOELECTRIC ACTUATOR USING SAME

(75) Inventor: Hiroyuki Kita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 18 days.

(21) Appl. No.: 10/929,687

(22) Filed: Aug. 31, 2004

(65) Prior Publication Data

US 2005/0040454 A1 Feb. 24, 2005

Related U.S. Application Data

(62) Division of application No. 10/356,603, filed on Feb. 3, 2003, now Pat. No. 6,849,166.

(30) Foreign Application Priority Data

Feb. 1, 2002 (JP) ............................ 2002-025123

(51) Int. Cl.
- H01L 29/76 (2006.01)
- H01L 29/94 (2006.01)
- H01L 31/062 (2006.01)
- H01L 31/113 (2006.01)
- H01L 31/119 (2006.01)

(52) U.S. Cl. ............... 257/310; 257/295; 257/312; 257/313; 257/E27.006

(58) Field of Classification Search ............ 257/295, 257/310, 312–313, E27.006
See application file for complete search history.

(56) References Cited

U.S. PATENT DOCUMENTS

| | | | |
|---|---|---|---|
| 5,142,437 A | 8/1992 | Kammerdiner et al. | 361/321.1 |
| 6,111,284 A | 8/2000 | Sakurai | 257/310 |
| 6,125,027 A * | 9/2000 | Klee et al. | 361/320 |
| 6,168,988 B1 * | 1/2001 | Schindler et al. | 438/253 |
| 6,494,567 B1 * | 12/2002 | Murai | 347/71 |
| 6,599,757 B1 * | 7/2003 | Murai | 438/3 |
| 6,709,776 B1 * | 3/2004 | Noguchi et al. | 428/702 |
| 6,955,927 B1 * | 10/2005 | Murai | 438/3 |
| 6,992,022 B1 * | 1/2006 | Shimamoto et al. | 438/780 |
| 2001/0026988 A1 * | 10/2001 | Matsui et al. | 438/381 |
| 2002/0027245 A1 * | 3/2002 | Noguchi | 257/345 |
| 2002/0096701 A1 * | 7/2002 | Torii et al. | 257/296 |
| 2003/0077874 A1 * | 4/2003 | Hsu et al. | 438/396 |
| 2005/0054122 A1 * | 3/2005 | Celii et al. | 438/3 |

FOREIGN PATENT DOCUMENTS

JP 1-308927 12/1989

(Continued)

Primary Examiner—Ida M. Soward
(74) Attorney, Agent, or Firm—Wenderoth, Lind & Ponack, L.L.P.

(57) ABSTRACT

In a manufacturing method for a piezoelectric actuator a first electrode layer is formed on substrate, a ferroelectric thin film is formed on the first electrode layer, and an inorganic protective layer 4 is formed on the ferroelectric thin film. Then, the inorganic protective layer 4 and the ferroelectric thin film are heat-treated under an oxygen containing atmosphere, and a second electrode layer is formed on an oxidation diffusion layer, wherein the oxidation diffusion layer is formed on a surface of the ferroelectric thin film as a result of component diffusion of the ferroelectric thin film and oxidation of the inorganic protective layer 4 due to the heat treatment. By using this method, it is possible to improve ferroelectricity without deterioration or cracking of a surface of the ferroelectric thin film.

8 Claims, 5 Drawing Sheets

FOREIGN PATENT DOCUMENTS

| | | |
|---|---|---|
| JP | 6-13565 | 1/1994 |
| JP | 7-45475 | 2/1995 |
| JP | 8-55967 | 2/1996 |
| JP | 9-102727 | 4/1997 |
| JP | 11-297945 | 10/1999 |

\* cited by examiner

FERROELECTRIC THIN FILM ELEMENT AND ITS MANUFACTURING METHOD, THIN FILM CAPACITOR AND PIEZOELECTRIC ACTUATOR USING SAME

This application is a divisional of U.S. Ser. No. 10/356,603, filed Feb. 3, 2003 now U.S. Pat. No. 6,849,166.

FIELD OF THE INVENTION

The present invention relates to a ferroelectric thin film element used as a thin film capacitor, a semiconductor memory and a piezoelectric actuator, and a method of manufacturing same.

BACKGROUND OF THE INVENTION

Recently, a ferroelectric thin film element is applied by, using its ferroelectricity, to a thin film capacitor, nonvolatile memory, a piezoelectric actuator using piezoelectricity, or an infrared sensor using pyroelectricity. In these applications, it is required to further improve characteristics of the ferroelectric thin film element. For example, with regard to application to a piezoelectric actuator, it is necessary to enlarge a piezoelectric constant. Also, in the case of a capacitor using a ferroelectric thin film element, leak current and coercive field are required to be at low levels, and deterioration due to reversal of polarization is required to be less.

As a method of manufacturing a ferroelectric thin film element to be applied to a piezoelectric actuator, the following method is disclosed in Japanese Laid-open Patent No. H1-308927. In this disclosure, a magnesium oxide mono-crystalline substrate (MgO substrate) is used. A platinum (Pt) layer oriented by (100) is formed by sputtering on the MgO substrate. Subsequently, a film is formed on the Pt layer by sputtering a target made from sintered material of lead zirconate titanate (PZT) under a condition that a substrate temperature is about 600° C., thereby forming a PZT layer vertically oriented to a film surface. However, in this manufacturing method, an optimum deposition range for obtaining excellent piezoelectricity is narrow, and it is necessary to strictly control film forming conditions. Further, in this manufacturing method, how to further improve piezoelectricity by heat treatment is not described at all.

Also, in application to a nonvolatile memory, a silicon mono-crystalline substrate (Si substrate) capable of forming various semiconductor circuits must be used as the substrate material. Heat treatment is usually executed after film forming in order to form a thin film dielectric element having excellent ferroelectricity on the Si substrate.

For example, in Japanese Laid-open patent No. H6-13565, for manufacture of a ferroelectric memory circuit by using ferroelectric film formed of a PZT layer, a method of improving characteristics of a ferroelectric capacitor by ozone annealing is shown. Ferrorelectric film formed by sputtering generally includes defects therein, and if an insulating layer of silicate glass or the like is formed by a chemical vapor-phase method on the ferroelectric capacitor, hydrogen atoms or nitrogen atoms are diffused into the ferroelectric film and turn into substitutionnal impurity atoms, sometimes causing deterioration of ferroelectricity. Ozone annealing is executed to cope with problems of such defects and deterioration, and to improve crystallinity by diffusing active oxygen into a layer which is generated due to decomposition of ozone. In this disclosure, ozone annealing is executed for every film forming process and again after forming ferroelectric film. However, when heat treatment is executed with the ferroelctric film exposed, deterioration or cracking of a surface layer is liable to take place, but a measure for this problem is not described at all.

Also, in Japanese Laid-open Patent No. H7-45475, for example, as for a thin film capacitor with a lower electrode layer, intermediate layer, dielectric layer, intermediate layer, and upper electrode layer formed on a substrate in this order, the intermediate layer is formed from a material containing a metallic element and oxygen. When the dielectric layer is of perovskite-type structure formed from lead (Pb) -magnesium, (Mg) -niobium (Nb) -oxygen (O), the intermediate layer is formed from a metallic element including Pb, Mg and Nb, and oxygen (O). This disclosure shows that, by forming an intermediate layer having such composition, it is possible to reduce stress caused due to different thermal expansion coefficients and to prevent generation of cracking or peeling during heat treatment. The intermediate layer has less oxygen (O) at a side coming in contact with the dielectric layer as compared with a side coming in contact with the electrode layer, and is formed by controlling partial pressure of oxygen (O), being a reactive gas, during a film forming process such as sputtering. As for the upper electrode layer side, an intermediate layer is formed on the dielectric layer, and further, the upper electrode layer is formed thereon, which is followed by heat treatment. The purpose of the intermediate layer on the upper electrode layer side is to reduce stress generated due to a difference in thermal expansion coefficients between the upper electrode layer and the dielectric layer. Accordingly, how to improve characteristics of the dielectric layer by executing heat treatment with an intermediate layer formed on the upper electrode layer side is not described at all. Also, when heat treatment is executed after forming the upper electrode layer, it is relatively difficult to sufficiently reduce thermal stress caused due to different thermal expansion coefficients. Therefore, cracking or peeling of the dielectric layer can be prevented but it may be difficult to prevent deterioration of ferroelectricity due to stress induced.

SUMMARY OF THE INVENTION

The present invention is intended to provide a manufacturing method of a ferroelectric thin film element, which method is capable of preventing deterioration or cracking of a thin film ferroelectric surface layer, which deterioration or cracking has been a conventional problem during heat treatment executed to improve characteristics of a ferroelectric thin film element. Also, the invention is intended to provide a thin film capacitor and piezoelectric actuator improved in characteristics by using a ferroelectric thin film element manufacturing by this method.

The method of manufacturing a ferroelectric thin film element of the present invention includes the steps of:

forming a first electrode layer on a substrate;

forming a ferroelectric thin film on the first electrode layer;

forming an inorganic protective layer on the ferroelectric thin film; and heat treating the protective layer and the ferroelectric thin film under an atmosphere containing oxygen, wherein the heat treatment causes the inorganic protective film to be oxidized and a part of a component of the ferroelectric thin film to be diffused, thereby forming an oxidation diffusion layer on which a second electrode layer is formed.

By this manufacturing method, ferroelectricity can be improved without surface deterioration or cracking, which is liable to take place during heat treatment of the ferroelectric thin film. Thus, it is possible to further improve characteristics of a thin film capacitor and piezoelectric actuator.

DETAILED DESCRIPTION OF THE EXEMPLARY EMBODIMENTS

The exemplary embodiments of the present invention will be described in the following with reference to the drawings.

First Exemplary Embodiment

Figure 1A:
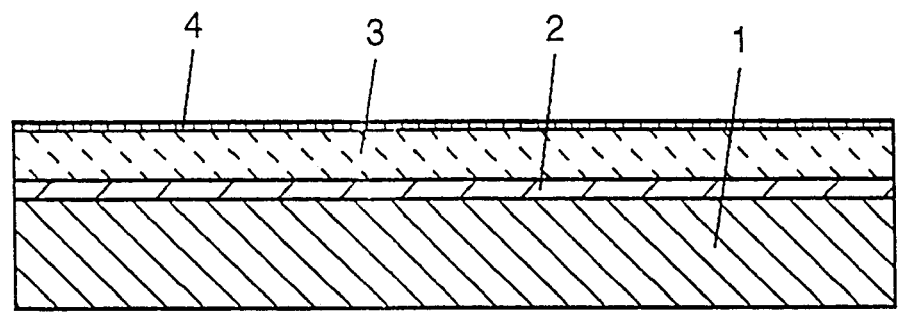
FIG. 1A is a diagram showing layers formed up to an inorganic protective layer during a manufacturing method of a first exemplary embodiment of the present invention.
Figure 1B:
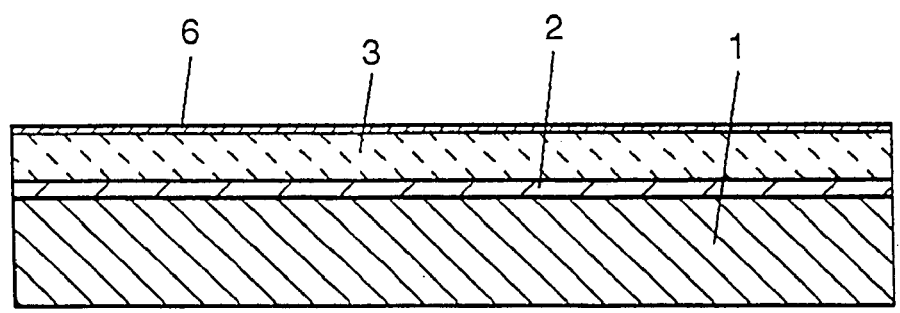
FIG. 1B is a diagram showing the inorganic protective layer and ferroelectric thin film heat-treated during the manufacturing method.
Figure 1C:
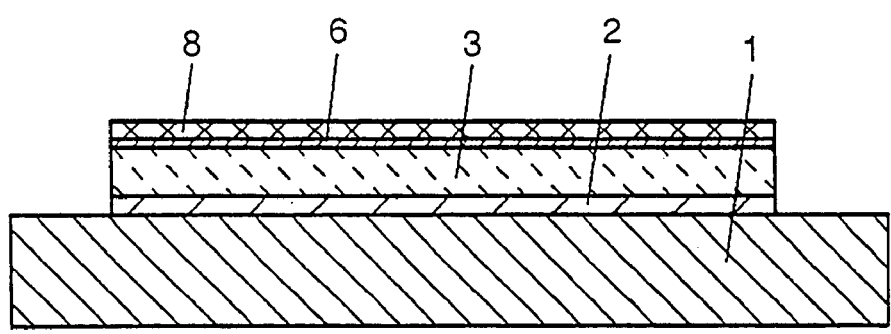
FIG. 1C is a diagram showing a second electrode layer formed as a ferroelectric thin film element during the manufacturing method.

The manufacturing method in the first exemplary embodiment of the present invention is described by using FIG. 1A to FIG. 1C. FIG. 1A shows a state of a first electrode layer, ferroelectric thin film, and inorganic protective layer formed on a substrate. FIG. 1B shows a state of the inorganic protective layer and ferroelectric thin film heat treated. Also, FIG. 1C shows a state of a second electrode layer formed as a ferroelectric thin film element.

In the present exemplary embodiment, an MgO monocrystalline substrate was used as substrate 1, and a Pt layer was formed as first electrode layer 2 on the substrate 1. The Pt layer is deposited 0.2 μm in thickness at a substrate temperature of about 600° C. by performing a sputtering process using a Pt target. It was confirmed by X-ray diffraction that the Pt layer being the first electrode layer 2 manufactured under these conditions is (100) oriented. Further, a PZT layer as ferroelectric thin film 3 was similarly formed by performing a sputtering process on the first electrode layer 2. Forming conditions of the ferroelectric thin film 3 are that the PZT layer is formed to be about 2 μm in thickness at a substrate temperature of about 650° C. by using a PZT target. By manufacturing a PZT layer on the Pt layer of MgO substrate under these conditions, it is possible to obtain a (001) oriented layer without heat treatment. After that, a Ti layer as an inorganic protective layer 4 was similarly formed by sputtering. Forming conditions of the inorganic protective layer 4 are that the layer is formed to be about 5 nm in thickness at room temperature by performing a sputtering process with use of a Ti target. A state of the inorganic protective layer 4 thus formed is shown in FIG. 1A.

Next, the inorganic protective layer 4 and the ferroelectric thin film 3 were heat-treated at 600° C. for 5 hours in atmospheric air. A state after this heat treatment is shown in FIG. 1B. The Ti layer being inorganic protective layer 4 is oxidized due to heat treatment, and simultaneously, a component of the PZT layer is diffused, causing an oxidation diffusion layer 6 to be formed. A second electrode layer 8 was formed on the oxidation diffusion layer 6. In the present exemplary embodiment, as the second electrode layer 8, Pt was formed by sputtering. After that, a pattern necessary as a ferroelectric thin film element was formed through performance of photolithography and an etching process. A state of the pattern thus formed is shown in FIG. 1C. This is called a sample or example of the present invention. It is also preferable to perform etching after forming the Ti layer as inorganic protective layer 4, followed by heat treatment.

Also, for purpose of comparison, a Pt layer and a PZT layer were formed under same conditions, and without forming of the inorganic protective layer 4 and heat treatment of these layers, the Pt layer was formed as the second electrode layer 8 in order to manufacture a ferroelectric thin film element. This is a conventional manufacturing method, and a sample produced thereby is called comparative sample or example A.

Further, a ferroelectric thin film element was manufactured by a method such that after forming the Pt layer and PZT layer, heat treatment is executed without forming inorganic protective layer 4, and after that, the Pt layer as the second electrode layer 8 is formed. The heat treating conditions are the same as in the case of the sample of the present invention. This is called comparative sample or example B.

A comparative sample or example C was also manufactured as followed. The substrate on which the Pt layer and PZT layer were formed, was heated in vacuum up to the a temperature the same as the above heat treatment temperature, followed by forming the second electrode layer 8 on the PZT layer in the same vacuum. This second electrode layer 8 has a two-layer structure of a Ti under layer and a Pt upper layer. The heat treatment temperature is same as in the sample of the present invention, but the heating time is about 2 hours.

That is, the comparative sample A is manufactured by a conventional method. The comparative sample B is formed by heat treatment in atmospheric air without forming inorganic protective layer 4. The comparative sample C is formed by heat treatment in vacuum without forming inorganic protective layer 4, and continuously forming an electrode layer of a two-layer structure of Ti and Pt as the second electrode layer 8.

Regarding the sample of the present invention and the three comparative samples, totaling four samples, layer surfaces were observed, and adhesion on second electrode layer 8, specific dielectric constant ($\epsilon$), hysteresis characteristic, remanent polarization (Ps), coercive field ($E_C$), lattice constant in the c-axis direction by X-ray diffraction and piezoelectric constant ($d_{31}$) were measured. The results of evaluation are shown in Table 1.

TABLE 1

|  | Sample of the invention | Comparative example A | Comparative example B | Comparative example C |
|---|---|---|---|---|
| Layer surface state | No deterioration | No deterioration | Fine cracking and whitening over entire surface | — |
| Second electrode layer adhesion | No peeling | No peeling | Easy to peel | No peeling |
| Specific dielectric constant: $\epsilon$ | 260 | 220 | 260 | 180 |
| Lattice constant c axis (nm) | 4.133 | 4.136 | 4.133 | — |
| Remanent Polarization: Ps ($\mu C/cm^2$) | 53 | 53 | 53 | — |
| Coercive electric field: $E_C$ (kV/cm) | 97/70 | 144/78 | 97/70 | — |
| Piezoelectric constant: $d_{31}$ (m/V) | 9.10E−11 | 8.20E−11 | 9.10E−11 | 7.30E−11 |

As is seen in Table 1, as for the example of the invention and comparative example B, the specific dielectric constant ($\epsilon$) and piezoelectric constant ($d_{31}$) are larger than those of comparative example A, showing that a piezoelectric characteristic is improved. Also, the lattice constant in the c-axis direction is improved to a value near the lattice constant of PZT in bulk. That is, it can be considered that the samples are improved in crystallinity by heat treatment as compared with comparative example A, resulting in improved piezoelectricity.

However, in comparative example B, fine cracking and whitening takes place over an entire surface after heat treatment, and the Pt layer being the second electrode layer 8 formed on the oxidation diffusion layer 6 is poor in adhesion and easy to peel. On the other hand, in the example of the invention, no deterioration or peeling is observed on a corresponding surface, and the Pt layer being the second electrode layer 8 is excellent in adhesion.

Also, in comparative example C, the second electrode layer 8 is excellent in adhesion, but the specific dielectric constant ($\epsilon$) and piezoelectric constant ($d_{31}$) are smaller than those of the samples manufactured by other methods.

Figure 2A:
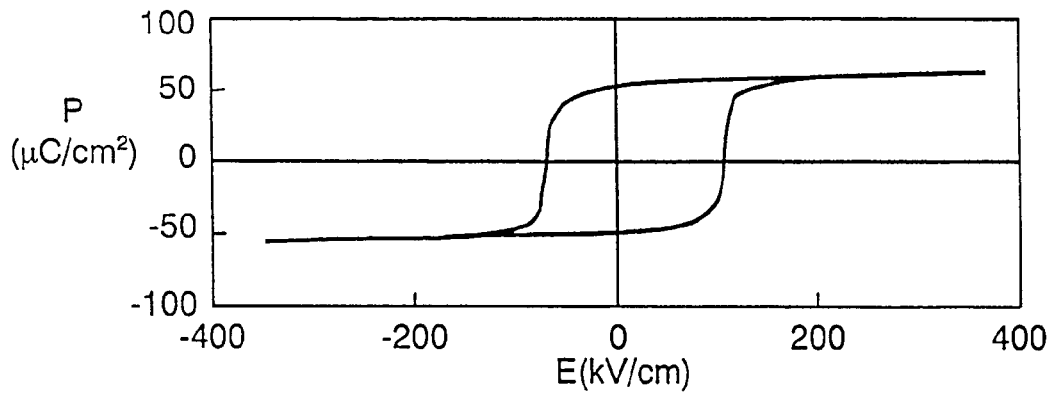
FIG. 2A is a diagram showing a hysteresis characteristic of a sample of the invention during the manufacturing method.
Figure 2B:
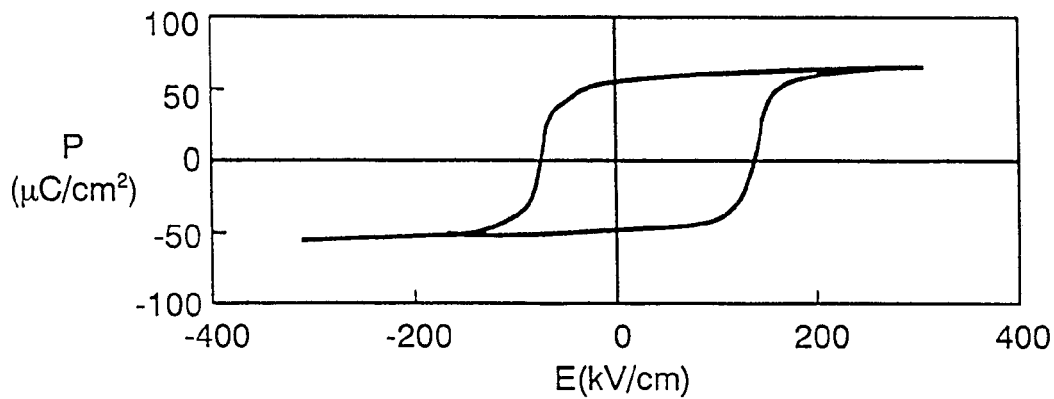
FIG. 2B is a diagram showing a hysteresis characteristic of comparative sample A prepared for a comparison with the exemplary embodiment.
Figure 2C:
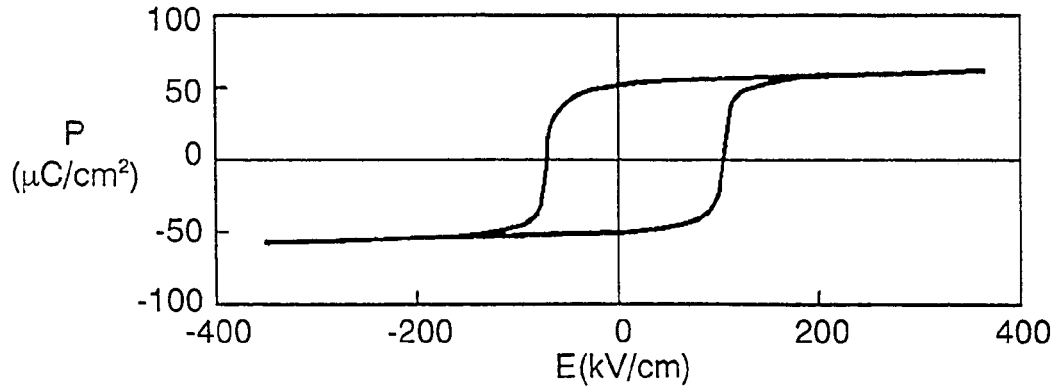
FIG. 2C is a diagram showing a hysteresis characteristic of comparative example B prepared for another comparison with the exemplary embodiment.

Further, measuring results of hysteresis characteristics of the sample of the invention, comparative example A, and comparative example B are shown in FIG. 2A to FIG. 2C. The measuring results of the sample of the invention, comparative example A, and comparative example B are respectively shown in FIG. 2A, FIG. 2B, and FIG. 2C. Also, the residual or remanent polarization (Ps) and coercive electric field ($E_C$) obtained from the measured results are shown in Table 1. The coercive electric field ($E_C$) is shown by a positive side value and a negative side value. As is obvious in these figures, the hysteresis characteristic can be improved from non-symmetrical shape to symmetrical shape about a polarizing axis by heat-treating the ferroelectric thin film 3.

From these results, it has been found that the specific dielectric constant ($\epsilon$) and piezoelectric constant ($d_{31}$) can be improved by heat-treating the PZT layer. However, it has also been found that sufficient adhesion of the second electrode layer 8 is not obtained if heat treatment is executed without forming a Ti layer as inorganic protective layer 4, as is seen in comparative example B. Also, as in comparative example C, it is clear that heating for forming the second electrode layer 8, so-called heat treatment in vacuum, causes deterioration of the hysteresis characteristic. On the other hand, it has been found that the piezoelectric characteristic, specific dielectric constant ($\epsilon$), and hysteresis characteristic are improved, and also sufficient adhesion of the second electrode layer 8 can be obtained when heat treatment is executed after forming a Ti layer as inorganic protective layer 4, as is seen in comparative example C. Thus, it has become possible to greatly improve characteristics with regard to application as a piezoelectric actuator or a thin film capacitor.

In the manufacturing method of the present invention, the Ti layer, being inorganic protective layer 4 formed on a surface of ferroelectric thin film 3, is oxidized during heat treatment, and a component of the ferroelectric thin film 3 reacts with the inorganic protective layer 4 and is diffused thereinto, causing oxidation diffusion layer 6 to be formed. The inventor found that such oxidation diffusion layer 6 is able to prevent contraction due to crystal growth of the ferroelectric thin film 3, or cracking caused by stress generated due to a difference in thermal expansion coefficient as compared to that of the substrate 1. Ti is a metallic element which is liable to be oxidized, and when the ferroelectric thin film 3 with inorganic protective layer 4 formed thereon is heat-treated in an oxygen containing atmosphere, the Ti layer is also oxidized, but the oxide reacts with the component of the ferroelectric thin film 3 at a relatively low temperature and is diffused thereinto. This must be the reason why it is possible to make up for contraction due to crystal growth of ferroelectric thin film 3, and to prevent deterioration of a surface layer.

For example, it is well known that $TiO_2$, being the oxide of Ti, and PbO, being one of the components of the PZT layer as the ferroelectric thin film 3 of the present invention, react with each other at a temperature higher than about 450° C. When heat treatment is executed after forming a Ti layer as inorganic protective layer 4, Ti is oxidized and simultaneously reacts with a component of the ferroelectric thin film 3 or is diffused thereinto, causing the oxidation diffusion layer 6 to be formed. Due to the oxidation diffusion layer 6, it is possible to effectively prevent surface deterioration or cracking of the ferroelectric thin film 3.

For example, since the oxide of Pb is evaporated at a relatively low temperature, the composition of ferroelectric thin film 3 is liable to change. Accordingly, the heat treatment of ferroelectric thin film 3 containing Pb is usually performed by an RTA (Rapid Thermal Annealing) process. However, with this, process since the heat treatment is rapidly executed in a short time, a temperature difference between substrate 1 and ferroelectric thin film 3 is also increased, resulting in addition of thermal stress, including temperature difference as well as a differential in thermal expansion coefficient. Therefore, cracking or film peeling is liable to take place due to heat treatment. However, when heat treatment is executed after forming inorganic protective layer 4, made up of Ti, on the surface of ferroelectric thin film 3, evaporation of Pb can be prevented because the oxide of Ti of the surface layer reacts with the oxide of Pb, and the layer has a capping effect against the evaporation of Pb. Due to this effect, there will be no peeling, cracking or surface deterioration, and also it is possible to realize growth of crystal even in case ferroelectric thin film 3 containing Pb is heat-treated in a furnace, and thereby, a characteristic of ferroelectric thin film 3 can be improved.

As inorganic protective layer 4 which displays such effect, it is preferable to use a material that is easy to react with the composition or component of the ferroelectric thin film 3. For example, when the ferroelectric thin film 3 is a PZT layer, it is possible to use not only the above-mentioned Ti layer, but a Zr layer or a mixed layer of Ti and Zr. Also, in case the ferroelectric thin film 3 is a $BaSrTiO_3$ layer, it is possible to use Ti or Sr as the inorganic protective layer 4. Also, in case the ferroelectric thin film 3 is a $Bi_4Ti_3O_{12}$ layer, it is possible to use a Ti layer as the inorganic protective layer 4. Further, when the ferroelectric thin film 3 is a $SrBi_2Ta_2O_9$ layer, it is possible to use a Ta layer, a Bi layer or a mixed layer of Ta and Bi as the inorganic protective layer 4. Further, in the case of using lanthanum added titanate zirconate (PLZT) or barium titanate as the ferroelectric thin film 3, it is possible to use a Ti layer, a Zr layer, or a mixed layer of Ti and Zr as the inorganic protective layer 4. Further, it is preferable to use Mg, Ca, Sr or La, as well as a combination of these materials. Also, in other cases of ferroelectric thin film 3, the effects of the present invention can be obtained by selecting materials of which mutual diffusion in relation to components is liable to take place, and evaporation is difficult during heat treatment.

The inorganic protective layer 4 is desirable to range from 1 nm to 100 nm in thickness. Further, it is more desirable to range from 1 nm to 20 nm for stabilization of characteristics. If the inorganic protective layer 4 is thicker than 100 nm, it will cause generation of thermal stress on the ferroelectric thin film 3 during heat treatment, which cannot be ignored. Furthermore, even when heat treatment is executed under an oxygen containing atmosphere, oxygen (O) is not sufficiently diffused into the ferroelectric thin film 3 with the inorganic protective layer 4 increased in thickness, and it is unable to make up for lack of oxygen in the film. As a result, ferroelectricity cannot be sufficiently improved. Accordingly, it is required that the inorganic protective layer 4 be 100 nm or less in thickness. On the other hand, it has been found from an experimental heat treatment with the layer varied in thickness, that the thickness is necessary to be at least 1 nm for properly obtaining the effect of the inorganic protective layer 4.

Also, when the thickness of inorganic protective layer 4 is 1 nm to 20 nm, it is possible prevent surface deterioration or cracking while greatly suppressing influence of thermal stress, and to supply sufficient oxygen (O) into the ferroelectric thin film 3, and therefore, crystallinity of the ferroelectric thin film 3 can be enhanced, thereby improving ferroelectricity. Further, in the range of this thickness, since the oxidation diffusion layer 6 formed is very thin, lowering of the specific dielectric constant and piezoelectricity, due to the layer, can be suppressed enough to be ignored, and characteristics are also improved.

As the inorganic protective layer 4, it is preferable to form a thin layer, entirely or partly oxidized at an initial stage. Also, as an oxygen containing atmosphere for heat treatment, it is preferable to add oxygen ($O_2$) gas or ozone ($O_3$) besides atmospheric air, or to create an atmosphere by producing oxygen atoms through decomposition of oxygen ($O_2$), nitrogen oxide ($N_2O$), or water ($H_2O$) by virtue of heat or plasma. As a temperature condition for this heat treatment, the optimum temperature varies with combination of materials for ferroelectric thin film 3 and inorganic protective layer 4, but it is possible to obtain the effect of the present invention when the temperature ranges from 300° C. to 1000° C. That is, when an inorganic protective layer 4 as mentioned above is used, oxidation occurs at 300° C., causing a component of ferroelectric thin film 3 to be diffused and an oxidation diffusion layer to be formed, and it is possible to prevent deterioration and cracking of the ferroelectric thin film 3 and to improve characteristics of the ferroelectric thin film 3. Also, as the ferroelectric thin film 3, there are many whose characteristics are deteriorated due to evaporation when heated at high temperatures, like a PZT layer. However, when the inorganic protective layer of the present invention is formed, it is possible to prevent such evaporation and improve characteristics by heating up to about 1000° C.

For example, as in the present exemplary embodiment, with a Ti layer used as inorganic protective layer 4, and a PZT layer used as ferroelectric thin film 3, when heated at 300° C. or higher, the Ti layer is oxidized and a component of the PZT layer is diffused, causing an oxidation diffusion layer to be formed, and deterioration and cracking of the ferroelectric thin film 3 can be prevented. Simultaneously, stress on the PZT layer is reduced, improving asymmetry or the like of the hysteresis characteristic. Also, as a heating duration, there is no particular limitations on the duration, except that very short durations as in an RTA process are not desired. In case of heating in a furnace, it is possible to immediately start cooling when the temperature reaches a specified level.

Also, in the present exemplary embodiment, the Ti layer is formed to be 5 nm thick as inorganic protective layer 4, and therefore, distribution of oxygen in a direction of film thickness is nearly uniform or oxygen-rich at a surface side, and there exists an area having a slope of decreasing oxygen density toward a ferroelectric thin film side.

In the present exemplary embodiment, an MgO substrate is used as the substrate 1, a Pt layer is used as the first electrode layer 2, PZT layer is used as the ferroelectric thin film 3, but the present invention is not limited to this configuration. For example, it is preferable to use a silicon substrate, a heat resisting glass substrate or a ceramic substrate, such as alumina with a silicon oxide layer or silicon nitride layer or the like formed thereon when a functional circuit like a transistor or the like is located on a surface and the ferroelectric thin film 3 is formed. Further, in the present invention, since heat treatment is executed before forming the second electrode layer 8, it is possible to use a metal relatively easy to be oxidized such as nichrome (NiCr), nickel (Ni) or copper (Cu) as the second electrode layer 8.

Figure 3A:
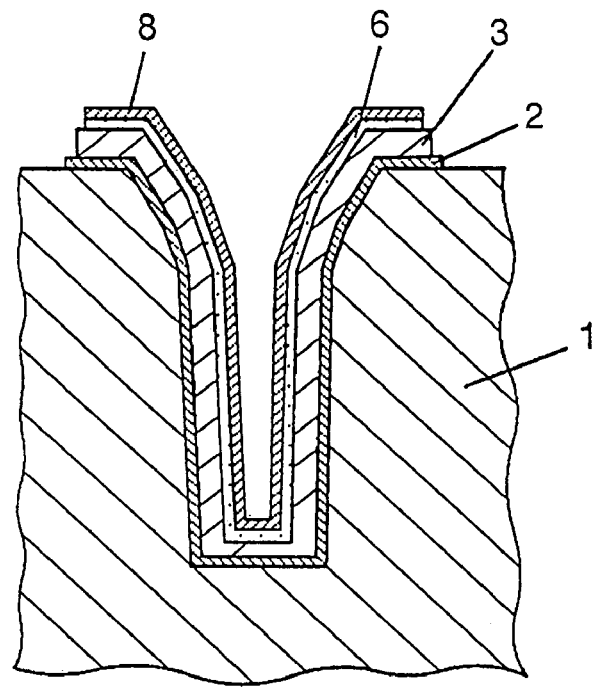
FIG. 3A is an explanatory diagram of a thin film capacitor with a trench structure manufactured by the manufacturing method.
Figure 3B:
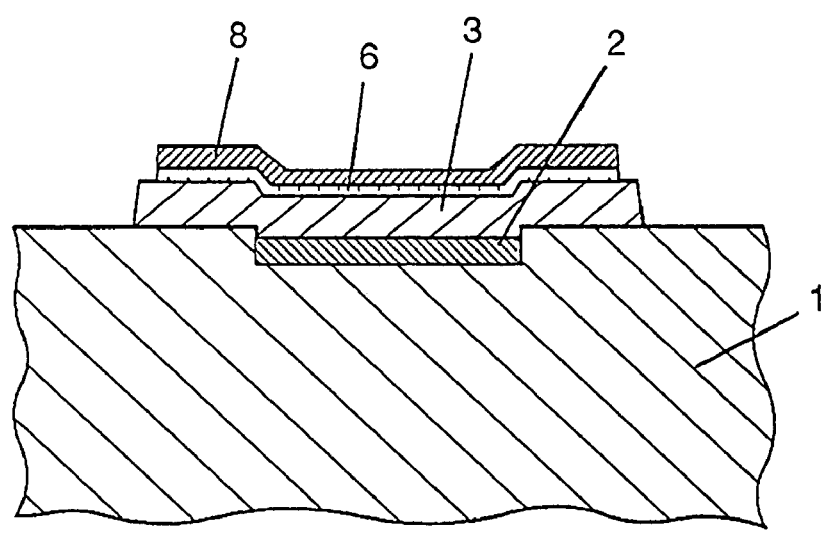
FIG. 3B is an explanatory diagram of a thin film capacitor with a stack structure manufactured by the manufacturing method.

Further, according to the manufacturing method in the present exemplary embodiment, a ferroelectric thin film element having a structure as shown in FIG. 1 can be used not only as a thin film capacitor but also as a thin film capacitor having a trench structure as shown in FIG. 3A using a silicon substrate, or having a stack structure as shown in FIG. 3B. FIG. 3A is a sectional view of a thin film capacitor with a trench structure, and FIG. 3B is a sectional view of a thin film capacitor with a stack structure.

The manufacturing method for a thin film capacitor with a trench structure of FIG. 3A will be described. Using a silicon substrate as substrate 1, a trench is formed in the substrate 1. After that, a double layer consisting of a Ti layer and a Pt layer as first electrode layer 2, a PZT layer as ferroelectric thin film 3, and a Ti layer as inorganic protective layer 4 are respectively formed by sputtering. A Ti layer as inorganic protective layer 4 is about 5 nm in thickness. Since the PZT layer formed on the Si substrate is not adequate in crystallinity, intended ferroelectricity cannot be obtained by sputtering only. Therefore, heat treatment at 650° C. is performed for one hour after forming a pattern by photolithography and etching. At this time, the inorganic protective layer 4 becomes oxidation diffusion layer 6, with no cracking or deterioration of the ferroelectric thin film 3 taking place and crystallinity being improved. After that, a thin film capacitor with a trench structure can be obtained by forming a Pt layer as the second electrode layer 8. As for the stack structure of FIG. 3B, a similar manufacturing method can be employed, and therefore, the description is omitted here.

By manufacturing a ferroelectric thin film element according the above method, characteristics can be improved or restored. That is, besides improvement in crystallinity of the ferroelectric thin film formed on the Si substrate as described above, when the thin film capacitor is formed as one-piece with a functional circuit element such as a transistor, the ferroelectric thin film is sometimes deteriorated, but despite such deterioration, it is possible to obtain a thin film capacitor having excellent characteristics by forming an inorganic protective layer such as Ti or Zr before executing heat treatment.

Second Exemplary Embodiment

Figure 4A:
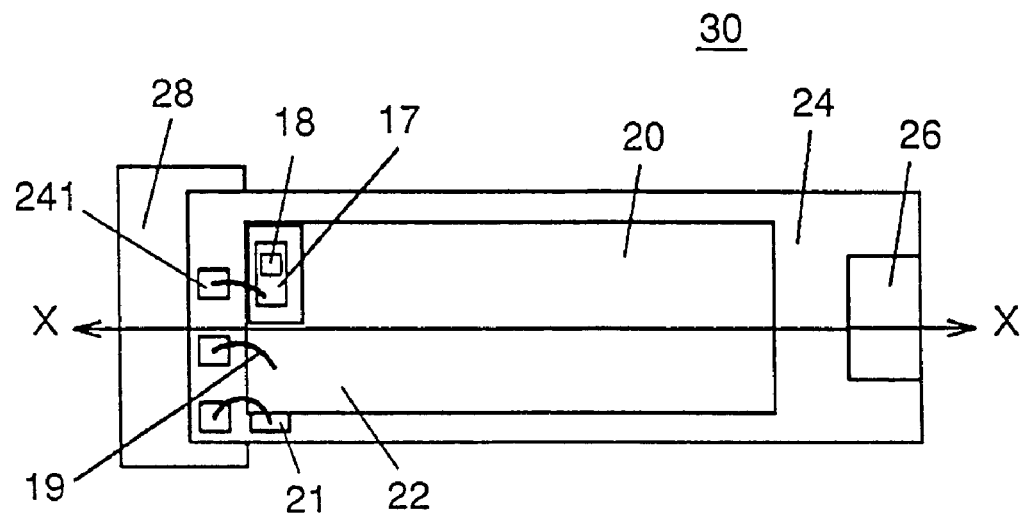
FIG. 4A is a plan view of a piezoelectric actuator of a second exemplary embodiment.
Figure 4B:
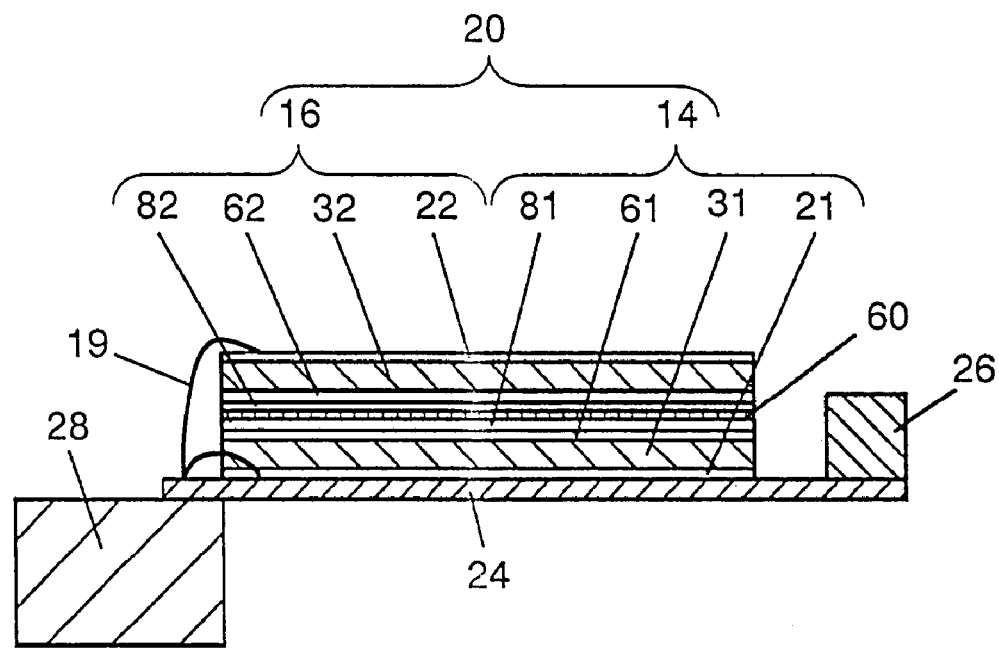
FIG. 4B is a sectional view of the actuator shown in FIG. 4A.

FIG. 4A is a plan view of piezoelectric actuator 30 with a laminate structure wherein a pair of ferroelectric thin film elements manufactured by the manufacturing method in the first exemplary embodiment of the present invention, and first electrode layers 21, 22 and second electrode layers 81, 82 of respective ferroelectric thin film elements are electrically connected with each other. FIG. 4B is a sectional view of the actuator.

A piezoelectric element 20 of this piezoelectric actuator 30 has a configuration in which the second electrode layers 81, 82 of ferroelectric thin film elements 14, 16 are opposed to each other and bonded by a bonding agent 60 into one piece. The piezoelectric element 20 is completely separated from a substrate by etching the substrate (not shown) after developing a configuration as shown, and before the piezoelectric element is bonded on resin substrate 24 via a bonding agent (not shown). Element 26 is similarly bonded on one end of the resin substrate 24. The piezoelectric actuator 30 comprises piezoelectric element 20, resin substrate 24, wire lead 19, element 26, and fixing portion 28.

When a voltage is applied between the first electrode layers 21, 22 and the second electrode layers 81, 82 of the respective ferroelectric thin film elements 14, 16, the piezoelectric element 20 is displaced in the X—X direction. Since an end of the resin substrate 24 is fixed on the fixing portion 28, the displacement of the piezoelectric element 20 causes the element 26 to be displaced in the X—X direction. By controlling this displacement via voltage applied, it is possible to realize a piezoelectric actuator 30 capable of accurately positioning the element 26 to an intended position. An entire thickness can be increased to enhance rigidity by laminating the ferroelectric thin film elements 14, 16. On the other hand, since the thickness of ferroelectric thin film elements 14, 16 can be reduced, displacement in the X—X direction can be increased with a low level of voltage applied.

A manufacturing method for the piezoelectric element 20 will be described. The ferroelectric thin film elements 14, 16 are manufactured by the same manufacturing method as described in the first exemplary embodiment of the present invention. That is, for example, Pt layers as the first electrode layers 21, 22, a PZT layers as ferroelectric thin films 31, 32, and a Ti layer an inorganic protective layer (not shown) are respectively laminated onto separate substrates in this order. After that, characteristics of ferroelectric thin films 31, 32 are improved by heat treatment at 600° C. for 5 hours in atmospheric air. This heat treatment causes the Ti layer, being the inorganic protective layer, to be oxidized and also a component of ferroelectric thin films 31, 32 to be diffused, thereby forming oxidation diffusion layers 61, 62. As the oxidation diffusion layers 61, 62 are formed, surfaces of ferroelectric thin films 31, 32 are free from deterioration or cracking, and piezoelectricity is improved.

After that, Pt layers as the second electrode layers 81, 82 are formed. After forming the second electrode layers 81, 82, the second electrode layers 81, 82, respectively formed on substrates, are opposed to each other and bonded by bonding agent 60. Thereafter, one of the two substrates bonded to each other is removed by etching, thereby exposing a laminate structure of the ferroelectric thin films 31, 32 respectively held between the first electrode layers 21, 22, and the second electrode layers 81, 82 on the other substrate. This laminate structure is configured as shown in FIG. 4A by performing photolithography and an etching process. In this way, after configuring as specified, piezoelectric element 20 completely separated from both substrates can be obtained by removing it from the other substrate by etching. The piezoelectric element 20 is fixed, by bonding, on resin substrate 24 at a specified position, and an electrode of piezoelectric element 20 is connected to an electrode portion 241 of resin substrate 24 by using wire lead 19 or the like. As for the second electrode layers 81, 82, these layers are led out onto a surface of piezoelectric element 20 through via-hole 18 and provided with an electrode layer 17. Thus, connections of the ferroelectric thin film elements 14, 16, and the electrode portion 241 of resin substrate 24 include three wire leads for the first electrode layer 21 of ferroelectric thin film element 14, the first electrode layer 22 of ferroelectric thin film element 16, and the electrode layer 17, and piezoelectric actuator 30 can be obtained by connecting these to the electrode portion 241 of resin substrate 24 by virtue of wire lead 19.

As described above, when heat treatment is executed after forming an inorganic protective layer on the ferroelectric thin films 31, 32, no cracking or deterioration takes place in the ferroelectric thin films 31, 32 because of oxidation diffusion layers 61, 62 formed, same as described in the first exemplary embodiment. Accordingly, adhesion to the ferroelectric thin films 31, 32 of the second electrode layers 81, 82 is improved, and also the second electrode layers 81, 82 can be reliably bonded to each other. As a result, it is possible to realize piezoelectric element 20 which assures excellent adhesion and reliability while improving piezoelectricity by heat treatment.

The piezoelectric element 20 of the present exemplary embodiment has a configuration with a pair of ferroelectric thin film elements 14, 16 laminated, but the present invention is not limited to this configuration. The piezoelectric element is also preferable to have a configuration with a single layer of a ferroelectric thin film element, and its manufacturing method is preferable to be same as the method described in the present exemplary embodiment. Also, in the present exemplary embodiment, the substrate is removed by etching at a final stage, but it is also preferable to execute etching in such way that part of the substrate at one side remains in an area which does not function as an actuator, where wire lead 19 is connected. Leaving part of the substrate increases strength, thereby enabling easy handling such as fitting or sticking.

Figure 5:
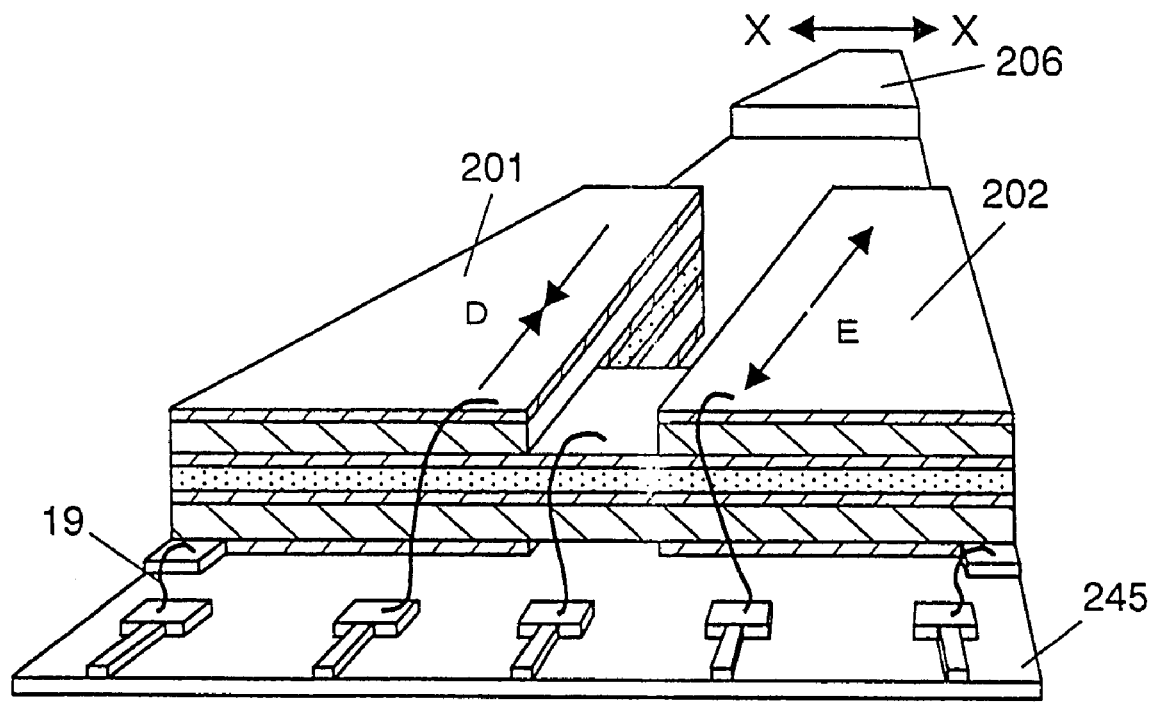
FIG. 5 is a perspective view of a piezoelectric actuator with a pair of piezoelectric elements of the second exemplary embodiment.

Further, it is also possible to use a configuration wherein piezoelectric elements 20 are arranged in parallel fashion and displaced in a direction vertical to a longitudinal direction of the piezoelectric actuator. For example, it is preferable to use piezoelectric actuator 250 as shown in FIG. 5. This piezoelectric actuator 250 comprises a pair of piezoelectric elements 201, 202 functioning as actuators. The piezoelectric elements 201, 202 are formed by the same manufacturing method as that used for the piezoelectric element 20 in the second exemplary embodiment. The piezoelectric elements 201, 202 are arranged in a mirror symmetrical fashion, with part of each element connected to each other. Such a configuration can be manufactured by the same method as used in the second exemplary embodiment, except that a mask is changed for etching.

The piezoelectric elements 201, 202 are bonded on resin substrate 245, and a first main electrode layer, a second main electrode layer, a first opposite electrode layer, and a second opposite electrode layer of each of the piezoelectric elements 201, 202 are connected to the electrode pad on a resin substrate by virtue of wire leads 19. Since the first opposite electrode layer and the second opposite electrode layer are fixed to each other by a bonding agent, it is sufficient to provide a connecting terminal at only one portion. Further, element 206 is mounted on the resin substrate 245 at an end side of an area functioning as an actuator for the piezoelectric elements 201, 202. Also, the resin substrate 245 is further extended up to the specified fixing portion, but only a part of the substrate is shown in FIG. 5.

Since the piezoelectric elements 201, 202 are arranged as described above, when a voltage is applied to each of the piezoelectric elements 201, 202, for example, so that the piezoelectric element 201 is contracted (in the direction shown by D) and the piezoelectric element 202 is expanded (in the direction shown by E), the element 206 can be displaced in the X—X direction by action of these combined forces. Such a piezoelectric actuator 250 can be used for fine positioning or the like of a magnetic head of a hard disk unit.

What is claimed is:

1. A ferroelectric thin film element, comprising:
   a first electrode layer formed on a substrate;
   a ferroelectric thin film formed on said first electrode layer such that said first electrode layer is between said substrate and said ferroelectric thin film;
   an oxidation diffusion layer formed on said ferroelectric thin film, wherein said oxidation diffusion layer is formed from an oxidized inorganic protective layer and a part of a component of said ferroelectric thin film; and
   a second electrode layer formed on said oxidation diffusion layer such that said oxidation diffusion layer is between said ferroelectric thin film and said second electrode layer.

2. The ferroelectric thin film element of claim 1,
   wherein in a relation between an amount of oxygen and a thickness of said oxidation diffusion layer, at least one condition exists in which the amount of oxygen decreases in proportion to the thickness toward said ferroelectric thin film.

3. The ferroelectric thin film element of claim 1,
   wherein said oxidation diffusion layer further includes at least one component, other than said part of said component of said ferroelectric thin film, diffused into the inorganic protective layer.

4. The ferroelectric thin film element of claim 3,
   wherein said ferroelectric thin film contains at least either titanium or zirconium as a component element; and
   the inorganic protective layer contains at least either titanium or zirconium.

5. The ferroelectric thin film element of claim 4, wherein said ferroelectric thin film contains lead as a component element.

6. A thin film capacitor that is to use a ferroelectric thin film element,
   wherein said ferroelectric thin film element comprises:
   a first electrode layer formed on a substrate;
   a ferroelectric thin film formed on said first electrode layer such that said first electrode layer is between said substrate and said ferroelectric thin film;
   an oxidation diffusion layer formed on said ferroelectric thin film, wherein said oxidation diffusion layer is formed by an oxidized inorganic protective layer and a part of a component of said ferroelectric thin layer; and
   a second electrode layer formed on said oxidation diffusion layer such that said oxidation diffusion layer is between said ferroelectric thin film and said second electrode layer.

7. A piezoelectric actuator, that is to use a ferroelectric thin film element,
   wherein a piezoelectric element of the piezoelectric actuator comprises:
   a first electrode layer formed on a substrate;
   a ferroelectric thin film formed on said first electrode layer such that said first electrode layer is between said substrate and said ferroelectric thin film;
   an oxidation diffusion layer formed on said ferroelectric thin film, wherein said oxidation diffusion layer is formed by an oxidized inorganic protective layer and a part of a component of said ferroelectric thin layer; and
   a second electrode layer formed on said oxidation diffusion layer such that said oxidation diffusion layer is between said ferroelectric thin film and said second electrode layer,
   wherein a portion of said substrate in an area corresponding to said ferroelectric thin film is removed.

8. A piezoelectric actuator that is to use a laminated pair of ferroelectric thin film elements,
   wherein each of said ferroelectric thin film elements of the piezoelectric actuator comprises:
   a first electrode layer formed on a substrate;
   a ferroelectric thin film formed on said first electrode layer such that said first electrode layer is between said substrate and said ferroelectric thin film;
   an oxidation diffusion layer formed on said ferroelectric thin film, wherein said oxidation diffusion layer is formed by an oxidized inorganic protective layer and a part of a component of said ferroelectric thin layer;
   a second electrode layer formed on said oxidation diffusion layer such that said oxidation diffusion layer is between said ferroelectric thin film and said second electrode layer; and
   connection wiring by which said first electrode layer and said second electrode layer of each of said ferroelectric thin film elements are electrically connected to each other;
   wherein said laminated pair is structured by using a bonding agent to bond together said second electrodes of said ferroelectric thin film elements, and
   wherein a portion of said substrate in an area corresponding to said ferroelectric thin film is removed.

* * * * *

UNITED STATES PATENT AND TRADEMARK OFFICE
CERTIFICATE OF CORRECTION

PATENT NO.        : 7,115,936 B2                                             Page 1 of 1
APPLICATION NO. : 10/929687
DATED             : October 3, 2006
INVENTOR(S)       : Hiroyuki Kita et al.

It is certified that error appears in the above-identified patent and that said Letters Patent is hereby corrected as shown below:

In column 12, line 55-56, please replace "each other;" with --each other,--.

Signed and Sealed this

Thirtieth Day of January, 2007

JON W. DUDAS
*Director of the United States Patent and Trademark Office*